United States Patent [19]

Moroni et al.

[11] Patent Number: 5,619,643
[45] Date of Patent: Apr. 8, 1997

[54] CIRCUIT FOR DETECTING A FAULT STATE IN A CLOCK SIGNAL FOR MICROPROCESSOR ELECTRONIC DEVICES

[75] Inventors: Angelo Moroni, Villanova S. fraz. Bargano; Flavio Scarra, Agrate; Alberto Taddeo, Arenzano, all of Italy

[73] Assignee: SGS-Thomson Microelectronics, S.R.L., Italy

[21] Appl. No.: 414,919

[22] Filed: Mar. 31, 1995

[30] Foreign Application Priority Data

Oct. 27, 1994 [EP] European Pat. Off. ............ 94830506

[51] Int. Cl.⁶ ...................................... G06F 11/00
[52] U.S. Cl. ................................. 395/182.21; 326/101
[58] Field of Search ..................... 395/550, 182.21; 326/101

[56] References Cited

U.S. PATENT DOCUMENTS 4,633,097  12/1986  Dewitt et al. .
5,109,506   4/1992  Begun ........................ 395/182.21
5,199,032   3/1993  Sparks et al. .

OTHER PUBLICATIONS

IBM Technical Disclosure Bulletin, vol. 37 No. 04B, Apr. 1994, pp. 185–188.

*Primary Examiner*—Thomas M. Heckler
*Attorney, Agent, or Firm*—Felsman, Bradley, Gunter & Dillon, LLP

[57] ABSTRACT

A circuit for generation of a reset signal in an electronic device, of the type comprising a microprocessor interlocked with a circuit generating a clock signal and memories of both the volatile type and the non-volatile type, is capable of detecting a stop in the oscillation of said clock signal and generating a logic signal coupled with the reset input of the microprocessor.

14 Claims, 2 Drawing Sheets

5,619,643

CIRCUIT FOR DETECTING A FAULT STATE IN A CLOCK SIGNAL FOR MICROPROCESSOR ELECTRONIC DEVICES

CROSS REFERENCE TO RELATED APPLICATION

The present application is related to U.S. patent application Ser. No. 08/414,104, entitled "METHOD AND CIRCUIT FOR DETECTING A FAULT IN A CLOCK SIGNAL FOR MICROPROCESSOR ELECTRONIC DEVICES INCLUDING MEMORY ELEMENTS" filed of even date herewith by the inventors hereof and assigned to the assignee herein, and incorporated by reference herein.

BACKGROUND OF THE INVENTION

1. Field of the Invention

The present invention relates to a circuit for detecting irregularities in a clock signal in electronic microprocessor devices.

The present invention applies in particular but not exclusively to a microcontroller device comprising a microcontroller, non-volatile memories (ROM, EPROM, EEPROM or FLASH EEPROM) and volatile memories (RAM) as well as input and output communication gates (I/O) and the following description is given with reference to this field of application only for the purpose of simplifying discussion thereof.

2. Description of the Prior Art

At present microcontrollers are commonly used in devices requiring an intelligent electronic control which is simple and flow in cost. For example they are used in the automobile field, automatic controls for industrial machine tools, safety devices, or in the new generation of electrical household appliances.

To reach the high degree of reliability required in these devices there is a trend towards equipping the microcontrollers with circuits designed to prevent or correct malfunctions in the devices or in the peripheral circuits connected thereto. These malfunctions can occur during normal use of the microcontroller or following wrong use thereof, e.g. when the correct timings for the signals applied at its inputs are not respected.

A typical circuit of this type inserted in many microcontrollers of the new generation is a circuit known to those skilled in the art as a "watchdog timer". This circuit was conceived to meet either hardware or software problems which can occur during operation of devices equipped with a microprocessor, and its use was subsequently extended to the field of microcontrollers.

The operating principle of said circuit is quite simple. The heart of the circuit is a counter whose internal register is incremented at a frequency equal to the clock signal of the microcontroller or a submultiple of said frequency. When the contents of the register reach the highest value, the circuit generates a hardware reset signal which reinitialises the microcontroller. By means of a special software instruction it is possible for a program to periodically zero the contents of the internal register of the counter. The program executed by the microcontroller calls for periodic zeroing to ensure correct operation of the entire system.

Contrariwise, if there occurs either a software or a hardware irregularity and normal program flow is interrupted, the register is no longer zeroed and the reset signal indicating malfunctioning reaches the microcontroller and reinitialises the system.

Generally the reset signal, which is generated in the microcontroller by the circuit just described, is also transferred to the exterior through a special terminal present in the microcontroller. It is thus possible to also hold the peripheral circuits interfaced with the microcontroller in reset state.

Although advantageous in some ways, this solution exhibits a serious shortcoming described below. If, following a failure in the circuit generating the clock signal, said signal is interrupted, even the watchdog circuit counter is in turn stopped, preventing correct operation of the latter circuit.

The microcontroller without the clock signal stops in a random unpredictable state. There can thus occur irregular situations in the microcontroller and also in the circuits interfaced therewith through the input and output communication gates (I/O).

The technical problem underlying the present invention is to provide a circuit capable of detecting irregularities in the clock signal, having structural and functional characteristics increasing the level of reliability of the microcontroller in which it is integrated, and overcoming the limitations and shortcomings indicated above with reference to the prior art.

SUMMARY OF THE INVENTION

An electronic device includes a microprocessor, a circuit generating a clock signal and memories of both the volatile type and the non-volatile type, and incorporates a circuit for generation of a reset signal capable of detecting a stop in the oscillation of said clock signal and generating a logic signal coupled with the reset input of the microprocessor.

The solution idea underlying the present invention is to monitor the clock signal applied to the microcontroller and, if any irregularity is detected, generate a reset signal which would hold the microcontroller in a safe state. The reset signal is held until the clock signal generating circuit resumes normal operation.

In this manner a situation is avoided in which in case of failure in the clock signal generating circuit, the microcontroller and the peripheral circuits interfaced therewith are left in irregular and unpredictable situations.

The characteristics and advantages of the circuit in accordance with the present invention are set forth in the description of an embodiment thereof given below by way of non-limiting example with reference to the annexed drawings.

DETAILED DESCRIPTION OF THE PREFERRED EMBODIMENT

Figure 1:
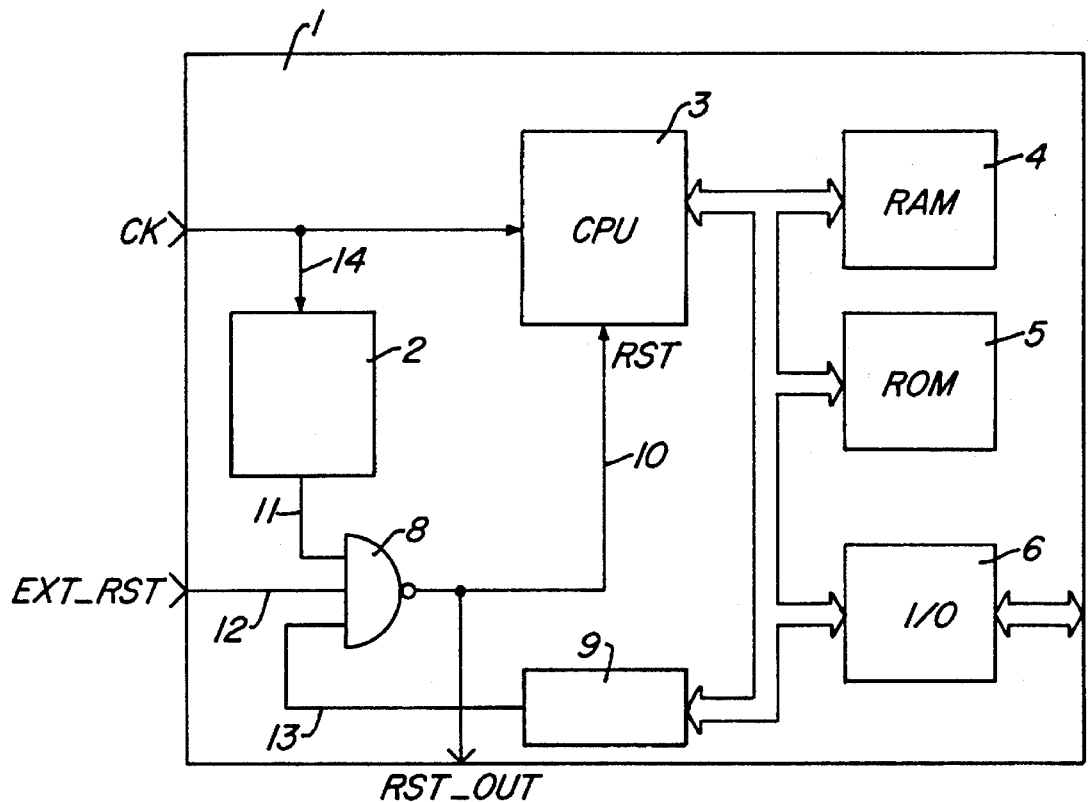
FIG. 1 shows a schematic view of the essential parts of a microcontroller incorporating a detector circuit provided in accordance with the present invention for clock signal irregularities.

With reference to the figures reference number 1 illustrates diagramatically an electronic microcontroller device, with said microcontroller comprising in a single semiconductor chip a microprocessor 3, a ROM matrix 5, a RAM matrix 4 and input and output communication gates 6. These circuits 3, 4, 5 and 6 communicate with each other through a group of electrical connections 7 known as data and address busses with which they are interfaced.

The non-volatile memory matrix 5 can be the electrically programmable and erasable type (EEPROM) or the read only type (ROM) and is used for memorising the sequence of instructions for the microprocessor 3. The volatile memory RAM 4 serves to temporarily store the data to be processed during execution of the program. Through the input and output communication gates 6, which are also interfaced with the bus 7, the microcontroller 3 can exchange data with the external devices.

Another block interfaced with the bus and indicated in the figures by 9 is a so-called "watchdog timer". As seen above, this circuit generates on one of its outputs a logic signal which reaches a first input 13 of a NAND logic gate 8. A second input 12 of said gate receives a reset signal coming from outside the microcontroller while a third input 11 is connected to the output of a circuit block 2.

The output 10 of the NAND logic gate 8 is connected to the reset input of the microprocessor 3 and to the outside of the microcontroller through a special terminal indicated in the figures by RST_OUT. In this manner, if at least one of the three inputs of the NAND gate 8 has low logic level the microprocessor is reset.

The circuit block 2 has an input 14 connected to the terminal CK of the microprocessor and on which is applied the clock signal. Said block 2 incorporates a circuit designed to detect irregularities in the clock signal.

Figure 2:
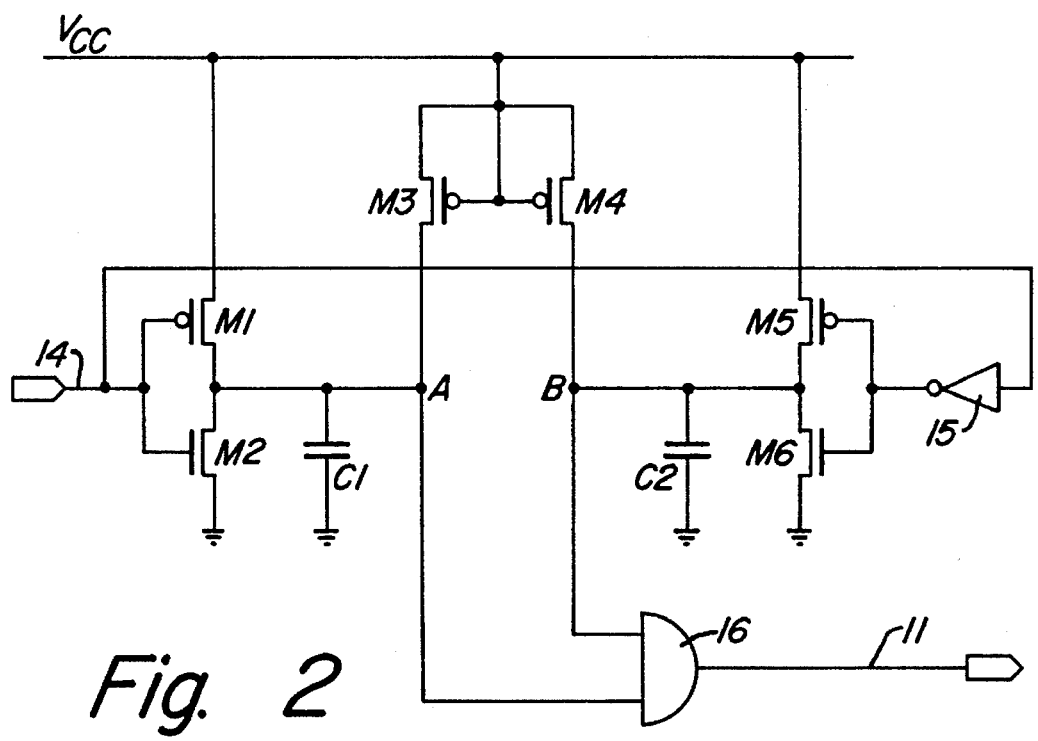
FIG. 2 shows an electrical diagram of an embodiment of the irregularity detection circuit inserted in the microcontroller of FIG. 1.

One embodiment of the circuit block 2 is shown in detail in FIG. 2. The input 14 of said block is connected to the control terminals of a first complementary pair of MOS transistors indicated by M1 and M2 and, through an inverting gate 15, to the control terminals of two other MOS transistors indicated by M5 and M6. Each pair of transistors is connected in series between a positive pole of the supply voltage generator Vcc and a negative pole of said generator, i.e. to the circuit ground.

In particular, the source terminal of the transistor M1 is connected to the positive pole of the power supply generator Vcc while its drain terminal is connected to the drain terminal of the transistor M2. The source terminal of the transistor M2 is connected to the circuit ground. Similarly the source terminal of the transistor M5 is connected to the positive pole of the power supply generator Vcc while its drain terminal is connected to the drain terminal of the transistor M6. The source terminal of the transistor M6 is connected to the circuit ground.

The drain terminals of the first pair of transistors M1 and M2 are connected together in the circuit node A and are also connected to a terminal of a first capacitor C1, to the drain terminal of a transistor M3 and to a first input of an AND logic gate 16. The second terminal of the first capacitor C1 is connected to the circuit ground.

The drain terminals of the second pair of transistors M5 and M6 are connected together in the circuit node indicated by B and are also connected to a terminal of a second capacitor C2, to the drain terminal of a transistor M4 and to a second input of the logic gate 16. The second terminal of the second capacitor C2 is connected to the circuit ground. The control terminals and the source terminals of the two transistors M3 and M4 are both connected to the power supply line Vcc. The output terminal of the logic gate 16 constitutes the output terminal 11 of the circuit block 2.

Operation of the circuit of FIG. 2 is now described. The clock signal present at the input 14 of the circuit, typically a square-wave signal, turns on the transistors M1 and M2 alternately. Consequently the circuit node A, which is also connected to terminal of the capacitor C1, is taken through the conduction resistances Ron1 and Ron2 of the two transistors M1 and M2 to the power supply voltage Vcc and to ground alternately.

In this manner the capacitor C1 is charged and discharged alternately through the two resistances Ron1 and Ron2. By dimensioning the transistors M1 and M2 in such a manner that the transistor M2 has a conduction resistance Ron2 much greater than the Ron1 of the transistor M1, in normal operation the capacitor C1 is charged at the power supply voltage Vcc and keeps high the logic level of an input of the logic gate 16.

The input 14 of the circuit is also connected through an inverting gate 15 to the control terminals of the second pair of transistors M5 and M6. The function of these two transistors is similar to that of the two transistors M1 and M2, and is to keep the capacitor C2 charged at the power supply voltage Vcc and hence hold a second input of the logic gate 16 at a high logic level.

The two transistors M5 and M6 are dimensioned in such a manner that the internal resistance Ron5 of the transistor M5 is much greater than that Ron6 of the transistor M6.

The output of the logic gate 16, which is an AND gate, is thus held at a high logic level during normal operation of the circuit.

If the clock signal present on the input 14 of the circuit stops at a high or low logic level, one of the two transistors M2 or M6 remains in conduction state and discharges the capacitor to which its drain terminal is connected.

If one of the two capacitors C1 or C2 is discharged, taking one of the two inputs of the logic gate 16 to a low logic level, the output of said gate changes state and passes from high logic level to low logic level. This logic signal is transferred through a second logic gate indicated by 8 in FIG. 1 to the reset input 10 of the microprocessor 3.

In this manner the microprocessor is held in the reset state until the clock signal is again enabled.

The two transistors M3 and M4, whose control and source terminals are connected together, act as diodes and consequently conduct if the voltage on the drain terminal exceeds the voltage on the other two terminals by a certain threshold value, typically less than one volt. The function of these transistors is to rapidly discharge the two capacitors C1 and C2 in case of an unexpected supply voltage failure so as to immediately reset the microprocessor.

In this embodiment the transistors M2 and M6 are n-channel MOS transistors while the transistors M1, M3, M4 and M5 are p-channel MOS transistors.

A basic factor which intervenes in the operation of this circuit is the physical size of the transistors M1, M2, M5 and M6 in the integrated circuit. An example of sizing by which the desired characteristics are achieved is shown in the following table.

|  | M1, M5 | M2, M6 |
| --- | --- | --- |
| W/L | 55/4 | 6/550 |
| Ron | low | high | where W indicates the width of the transistor channel, L indicates the length of the channel and Ron indicates the resistance of the transistor in the conduction state.

Indeed, the dimensional ratio between the width W and length L of the channel of a transistor is one of the main factors determining the internal resistance in the conduction state.

Figure 3:
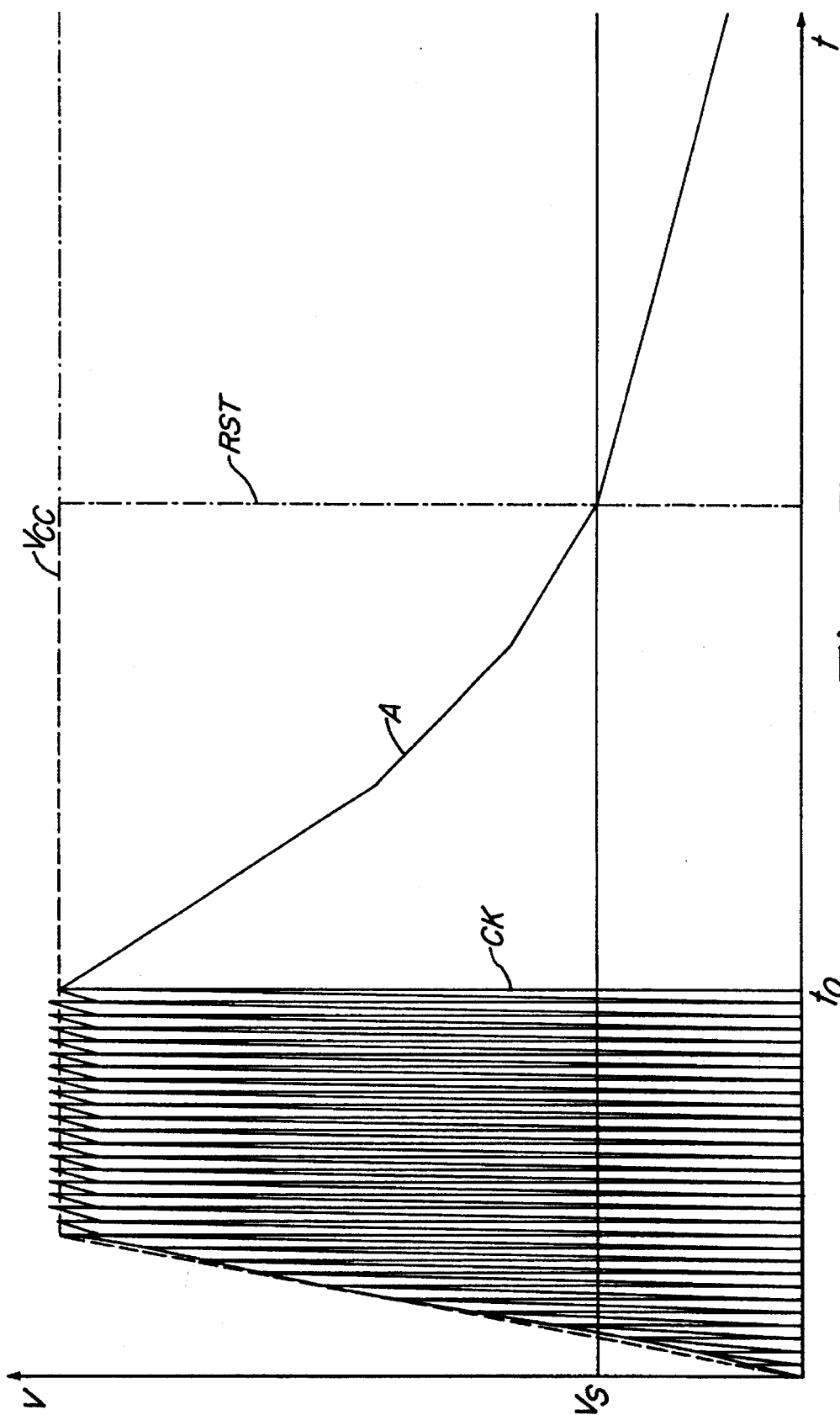
FIG. 3 shows diagramatically the behaviour in time of a group of electrical signals present in the circuit of FIG. 2.

FIG. 3 shows the behaviour in time of a group of electrical signals present in the circuit of FIG. 2. In particular it may be seen that at the instant to when the clock signal CK fails the voltage on the circuit node A begins to fall following discharge of the capacitor C1. When this voltage falls below a certain threshold value Vs the signal RST, present at the output of the logic gate 8, passes from a low logic level to a high logic level to reset the microprocessor 3. The figure also shows the level of the power supply voltage Vcc from the moment the circuit is energized.

The reset signal generation method in accordance with the present invention is now described.

As set forth in the above description the method in accordance with the present invention requires that the reset signal be applied to the microprocessor 3 as a logic function among three signals, a first logic reset signal EXT_RST coming from outside the device, a second logic signal coming from the output 14 of the power-on reset circuit 9 and a third logic signal coming from the circuit 2 and capable of detecting a stop in the oscillation of the clock signal applied to the microprocessor 3.

Specifically the logic function is carried out by a NAND logic gate 8 whose output 10 is connected to the reset input RST of the microprocessor 3. In this manner if at least one of the three inputs of the NAND gate 8 is at low logic level the microprocessor is reset.

Therefore if the clock signal stops at a certain logic level, high or low, the microprocessor 3 is held in reset state until said signal resumes oscillating, overcoming the problems of the known art discussed above.

I claim:

1. A circuit for detecting irregularities in a clock signal in an electronic device incorporating a microprocessor comprising:

an input terminal;

an output terminal connected to a reset input of the microprocessor;

a first input stage comprising a first complementary pair of transistors connected between a positive pole of a supply voltage generator and a negative pole of said generator, the control terminals of the first transistor pair being both connected to said input terminal and an intermediate circuit node between the transistors of the first pair being connected to a first input of a logic gate having an output terminal connected to the output terminal of the circuit, a first capacitive element connected between the intermediate circuit node between the transistors of the first pair and a first potential reference, a second input stage comprising a second complementary pair of transistors connected between the positive pole and the negative pole of said generator, the control terminals of the second pair being connected both to said input terminal through an inverting gate and the intermediate circuit node between the transistors of the second pair being connected to a second input of said logic gate; and a second capacitive element connected between the intermediate circuit node between the transistors of the second pair and a second terminal connected to a second potential reference.

2. The Circuit of claim 1 wherein said logic gate is an AND type logic gate having at least two input terminals and one output terminal.

3. The Circuit of claim 1 wherein said first potential reference coincides with said second potential reference.

4. The Circuit of claim 1 wherein said first and second transistor pairs are each made up of an n-channel MOS transistor and a p-channel MOS transistor.

5. The Circuit of claim 4 wherein the p-channel MOS transistors of said first and second pairs have conduction resistances lower than the conduction resistances of the n-channel transistors.

6. The Circuit of claim 1 wherein the intermediate circuit node between the transistors of the first pair is connected through a first junction element to said positive pole of the supply voltage generator and the intermediate circuit node between the transistors of the second pair is connected through a second junction element to said positive pole of the supply voltage generator.

7. The Circuit of claim 6 wherein said first and second junction elements are junction elements of the p-n type provided each by means of a p-channel MOS transistor.

8. A microcontroller comprising:

a circuit for detecting irregularities in a clock signal in an electronic device including:

an input terminal;

an output terminal connected to a reset input of the microprocessor;

a first input stage comprising a first complementary pair of transistors connected between a positive pole of the supply voltage generator and a negative pole of said generator, the control terminals of the first transistor pair being both connected to said input terminal and the intermediate circuit node between the transistors of the first pair being connected to a first input of a logic gate having an output terminal connected to the output terminal of the circuit, a first capacitive element connected between the intermediate circuit node between the transistors of the first pair and a first potential reference, a second input stage comprising a second complementary pair of transistors connected between the positive pole and the negative pole of said generator, the control terminals of the second pair being connected both to said input terminal through an inverting gate and the intermediate circuit node between the transistors of the second pair being connected to a second input of said logic gate; and a second capacitive element connected between the intermediate circuit node between the transistors of the second pair and a second terminal connected to a second potential reference.

9. The Circuit of claim 8 wherein said logic gate is an AND type logic gate having at least two input terminals and one output terminal.

10. The Circuit of claim 8 wherein said first potential reference coincides with said second potential reference.

11. The Circuit of claim 8 wherein said first and second transistor pairs are each made up of an n-channel MOS transistor and a p-channel MOS transistor.

12. The Circuit of claim 11 wherein the p-channel MOS transistors of said first and second pairs have conduction resistances lower than the conduction resistances of the n-channel transistors.

13. The Circuit of claim 8 wherein the intermediate circuit node between the transistors of the first pair is connected through a first junction element to said positive pole of the supply voltage generator and the intermediate circuit node between the transistors of the second pair is connected through a second junction element to said positive pole of the supply voltage generator.

14. The Circuit of claim 13 wherein said first and second junction elements are junction elements of the p-n type provided each by means of a p-Channel MOS transistor.

* * * * *